United States Patent [19]

Ponjeé et al.

[11] 4,093,504

[45] June 6, 1978

[54] METHOD FOR PRODUCING ELECTRICALLY CONDUCTIVE INDIUM OXIDE PATTERNS ON AN INSULATING SUPPORT BY ETCHING WITH HYDROCHLORIC ACID AND FERRIC CHLORIDE

[75] Inventors: Johannes J. Ponjeé; Hendrik J. Feil, both of Eindhoven, Netherlands

[73] Assignee: U.S. Philips Corporation, New York, N.Y.

[21] Appl. No.: 712,040

[22] Filed: Aug. 5, 1976

[30] Foreign Application Priority Data

Jun. 8, 1975 Netherlands .......................... 7509341

[51] Int. Cl.$^2$ ............................................. C23F 1/02
[52] U.S. Cl. ...................... 156/656; 156/667; 96/36.2; 427/109; 427/126; 427/96; 427/99; 204/192 F; 252/79.2
[58] Field of Search ................. 427/109, 126, 259, 96, 427/99; 156/8, 15, 16, 665, 667, 656, 659, 635; 252/79.2; 134/3, 41; 204/192 F, 192 S; 428/1; 96/36, 36.2

[56] References Cited

U.S. PATENT DOCUMENTS

| | | | |
|---|---|---|---|
| 2,154,027 | 4/1939 | Brennan | 156/665 |
| 2,631,950 | 3/1953 | Rosenfeld et al. | 134/3 |
| 2,684,892 | 7/1954 | Saulnier | 252/79.2 |
| 2,699,382 | 1/1955 | Altenpohl | 156/665 |
| 3,348,987 | 10/1967 | Stark et al. | 156/17 |
| 3,562,038 | 2/1971 | Shipley, Jr. et al. | 428/901 X |
| 3,824,136 | 7/1974 | Gilbert | 252/79.2 |
| 3,837,944 | 9/1974 | Cole | 96/36.2 |
| 3,979,240 | 9/1975 | Ghezzo | 156/8 |

FOREIGN PATENT DOCUMENTS

| | | | |
|---|---|---|---|
| 7,104,883 | 2/1971 | Japan | 252/79.2 |
| 1,406,894 | 9/1975 | United Kingdom | 156/656 |

OTHER PUBLICATIONS

Gregory, Uses & Applications of Chemical and Related Materials, Reinhold 1939, p. 285.

*Primary Examiner*—Ralph S. Kendall
*Attorney, Agent, or Firm*—Frank R. Trifari; Norman N. Spain

[57] ABSTRACT

Etching indium patterns on insulating supports with the use of an etchant-resistant mask, by means of a solution of an acid to which ferric chloride has been added. Passivation of the bath is prevented by adding ferric chloride.

2 Claims, No Drawings

METHOD FOR PRODUCING ELECTRICALLY CONDUCTIVE INDIUM OXIDE PATTERNS ON AN INSULATING SUPPORT BY ETCHING WITH HYDROCHLORIC ACID AND FERRIC CHLORIDE

The invention relates to a method for producing electrically conductive indium oxide patterns on an insulating support, to the products fabricated in this manner and to devices comprising these products as electrodes.

These transparent patterns are used in electrochromic display panels and in display panels which have been provided with a liquid crystal coating such as described inter alia in U.S. Pat. Nos. 3,451,741 and 3,322,485 respectively. The conductive layers may consist of non-doped indium oxide or of indium oxide which has been doped with another oxide, for example $SnO_2$ or $Sb_2O_3$ for adjusting a certain level of the surface resistance. The layers can be provided on a transparent substrate by means of hydrolysis or pyrolysis of compounds of said metals, by means of vacuum deposition or by means of cathodic sputtering. The desired pattern can thereafter be obtained by photo-etching with the use of a photo resist, the oxide material which extends to beyond the desired pattern being removed.

An aqueous solution of hydrochloric acid (37%; etching time approximately 30 minutes at ambient temperature) may be used as an etching bath. However, this bath has the drawback that when etching indium coatings on, for example, glass this bath is often passivated after a short time, that is to say the etching rate diminishes gradually until no reaction occurs at all, while the acid concentration of the bath has hardly diminished.

The invention provides an etching solution which does not have the above-mentioned drawbacks so that passivation does not occur at all. Furthermore, its etching rate depends considerably less on the manner in which the indium oxide is applied than for the known etching solution.

The method for producing electrically conductive patterns consisting for at least 80 mol.% of indium oxide, on insulating supports by means of which a uniform layer, mainly consisting of indium oxide is applied on the support, the layer is provided with an etchant-resistant coating in a negative image of the desired pattern, the uncoated layer is removed by dissolving it in a acid bath and the etchant-resistant coating is removed, is characterized according to the invention in that the bath comprises ferric chloride in addition to dissolved acid in a quantity between 0.01 mol./l and the saturation concentration.

A bath which contains 37% by weight or HCl and in which 30g of $FeCl_3$ has been dissolved per liter, removes at ambient temperature a 0.1 $\mu$m thick layer of $In_2O_3$ in 15 minutes. The bath retains its activity for a very large number of immersions of supports from which the indium oxide must be removed.

An etching bath which contains 18% by weight of HCl in which 5.5g of $FeCl_3$ (0.07 mol) is dissolved per liter behaves in a similar manner. This etching bath removes a 0.1 $\mu$m thick layer of $In_2O_3$ in about 10 minutes at 45° C.

An etching bath which contains 18% by weight of HCl and 66g/l of $FeCl_3$ removes at 45° at 0.1 $\mu$m thick indium oxide layer in 1.5 to 8 minutes, depending on the nature and the concentration of the doping and the manner in which the layer has been applied.

A bath which has been heated to 45° C, which contains only 18% by weight of HCl indeed removes also a 0.1 $\mu$m thick layer of $In_2O_3$ in approximately 8 minutes, but owing to passivation this bath is already ineffective after having etched one sample only.

What is claimed is:

1. A method of producing an electrically conductive pattern comprising forming a uniform layer of indium oxide on an electrically insulating support, applying to said indium oxide layer an etch-resistant coating in the negative image of the desired pattern, applying to said thus coated layer an aqueous hydrochloric acid etching solution containing in addition to the acid, ferric chloride in a quantity of between 0.01 mol/l and the saturation concentration thereof.

2. A method as claimed in claim 1 wherein the bath consists of an aqueous solution of HCl which contains 66g of $FeCl_3$ per liter.

* * * * *

UNITED STATES PATENT AND TRADEMARK OFFICE
CERTIFICATE OF CORRECTION

PATENT NO. : 4,093,504
DATED : June 6, 1978
INVENTOR(S) : JOHANNES J. PONJEE ET AL It is certified that error appears in the above-identified patent and that said Letters Patent are hereby corrected as shown below:

Under [30] Foreign Application Priority Data

Change "June 8, 1975" to -- August 6, 1975 --

Signed and Sealed this

Fifth Day of June 1979

[SEAL]

Attest:

RUTH C. MASON
*Attesting Officer*

DONALD W. BANNER
*Commissioner of Patents and Trademarks*